United States Patent [19]

Hendrickson et al.

[11] 4,148,046
[45] Apr. 3, 1979

[54] SEMICONDUCTOR APPARATUS

[75] Inventors: Thomas E. Hendrickson, Wayzata; Jack S. T. Huang, Plymouth, both of Minn.

[73] Assignee: Honeywell Inc., Minneapolis, Minn.

[21] Appl. No.: 869,977

[22] Filed: Jan. 16, 1978

[51] Int. Cl.² .............................................. H01L 29/72
[52] U.S. Cl. .......................................... 357/23; 357/22; 357/41; 357/42; 357/45
[58] Field of Search .................... 357/22, 23, 41, 42, 357/45

[56] References Cited

U.S. PATENT DOCUMENTS

| 3,783,349 | 1/1974 | Beasom | 357/23 |
| 4,015,278 | 3/1977 | Fukuta | 357/22 |

Primary Examiner—Edward J. Wojciechowicz
Attorney, Agent, or Firm—Theodore F. Neils

[57] ABSTRACT

A field-effect transistor device is provided having a relatively substantial capability to withstand reverse bias voltages. The device can also be provided having a relatively low "on" condition resistance between the source and drain terminals thereof by virtue of the geometrical design used.

58 Claims, 16 Drawing Figures

FIG. 1C
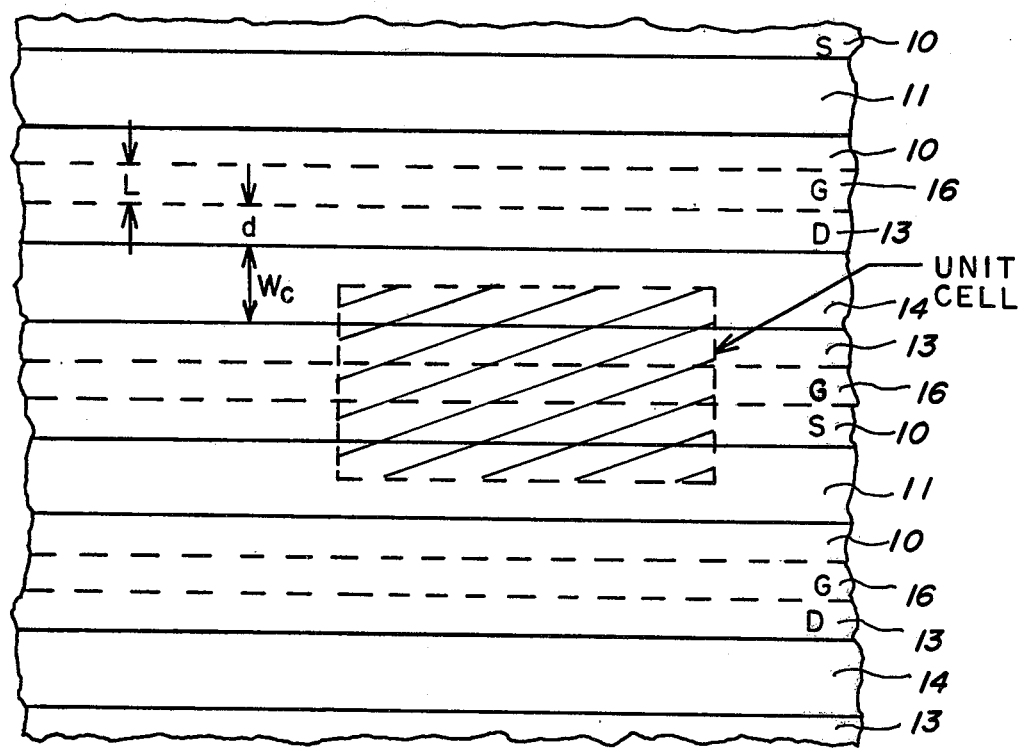
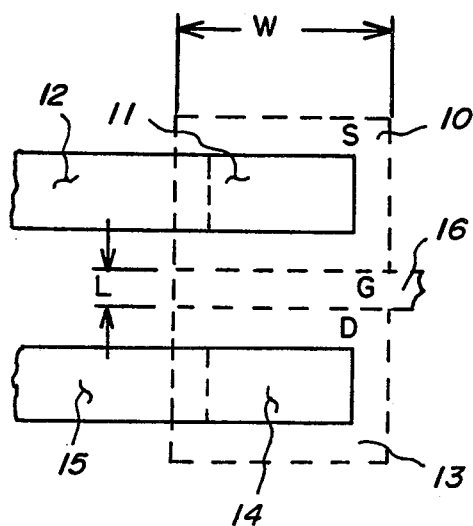
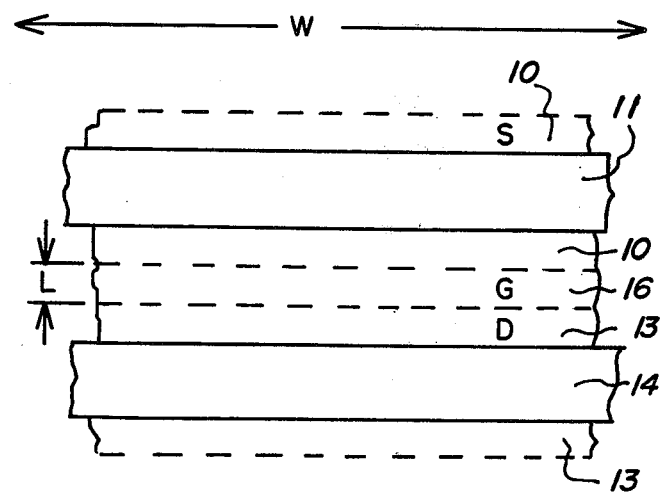
FIG. 1A
FIG. 1B

SEMICONDUCTOR APPARATUS

REFERENCE TO CO-PENDING APPLICATIONS

Reference is hereby made to co-pending applications by T. E. Hendrickson entitled "Semiconductor Apparatus" having Ser. No. 869,981 and by T. E. Hendrickson and J. M. Daughton entitled "Semiconductor Apparatus" having Ser. No. 869,980, which were both filed on even date with the present application and which are both assigned to same assignee as the present application. Both co-pending applications disclose to some extent but do not claim the semiconductor devices which are specifically disclosed and claimed in the present application.

BACKGROUND OF THE INVENTION

The present invention is related to field-effect transistor devices for electrical signal control and switching, particularly analog signals, and more particularly, to the geometry and other material properties of the field-effect transistor device design for a field-effect transistor device analog signal switch.

The field-effect transistor has certain attributes which are attractive for analog signal switching. The first of these is that a field-effect transistor can be a bilateral device so that, for AC signal switching, the field-effect transistor appears to have the same output characteristics whatever the voltage polarities are at which the designated source and drain regions in the device happened to be operated at during any point in an AC voltage cycle. Further, there is no offset voltage in the source-drain volt-ampere characteristics of a common source operated field-effect transistor as there is in the collector volt-ampere characteristic of a common emitter operated bipolar transistor.

A problem with the field-effect transistor for use as a analog signal switch exists, however, in that the "on" condition resistance between the drain and source of the field-effect transistor is typically quite a bit higher than that experienced, for instance in the output of a bipolar transistor. Such an "on" condition drain-to-source resistance, or channel resistance, has deleterious effects on switching operations. First, this resistance increases the power dissipation occurring in the switch when in the "on" condition, a situation which is particularly troublesome if the field-effect transistor device is to be used as a power device carrying substantial currents in the "on" condition. Secondly, this "on" condition resistance slows the switching speed of the field-effect transistor-load combination limiting the usefulness of the switch for controlling rapidly changing analog signals.

For field-effect transistors formed in a semiconductor body, such as in FIG. 1A, the "on" condition drain-to-source resistance has been found to depend upon various material parameters of the materials used in the construction thereof, and upon the dimensions thereof; in the latter instance, particularly, upon the effective width and length of the field-effect transistor device in the semiconductor material used. That is, the "on" condition channel resistance is dependent upon the effective length of the channel between the sources and drains therein, and upon the effective width of the channel between sources and drains therein facing one another across the channel. The following relationship has been found:

$$R_{on} \propto L/w.$$

As is also known, the "punch-through" voltage and the device switching time device parameters are each determined substantially by the channel length, L, with both decreasing with decreasing L. Thus, one might conclude that channel length L in the stripe geometry transistor of FIG. 1A should be made as small as practically possible while increasing the channel width, w, to the extent necessary to achieve a satisfactorily small $R_{on}$. That is, one might keep the channel length as short as possible, consistent with the design layout rules required by the fabrication process and with the need to maintain an adequate punch-through voltage minimum for operation in the "off" condition, and then extend the channel width until a satisfactory "on" condition drain-to-source resistance is achieved. The result of this design criteria is suggested in FIG. 1B.

In FIGS. 1A and 1B, the source region, 10 is formed beneath, but intersecting, a planar major surface of a semiconductor material body, this surface supporting an insulating layer thereover. The source region is also marked by S. A cut or opening, 11, in the insulating layer is shown to accommodate an electrical contact to source 10, and this contact is shown made by an external interconnection means, 12, in FIG. 1A. There need not be an external connector, however, as source region 10 may be extended to other regions in the semiconductor material body to thereby provide its own interconnection. No such external interconnection is shown in FIG. 1B where source 10 is indicated to extend indefinitely until some value of w is reached which provides a suitably small "on" condition channel resistance. Again, however, between solid lines, region 11 is shown in FIG. 1B to accommodate an external interconnection means.

A drain region, 13, is shown in FIGS. 1A and 1B and marked with a D. Again, a cut or opening, 14, is shown for providing a connection to source 13 via this opening by an external interconnection means, 15, by way of example. In FIG. 1B, again the drain region 13 shown to extend indefinitely until a satisfactory w dimension is reached to provide a sufficiently small $R_{on}$.

FIGS. 1A and 1B each have a gate structure 16, between source region 10 and drain region 13. Structure 16 may either be a gate conductor for a MOSFET, separated therefrom by an insulating layer, or structure 16 may be part of an interconnection means for electrically connecting to the gate region provided in a JFET.

Thus, FIG. 1B represents a possible method for increasing the channel width w to the extent necessary to reduce the "on" condition channel resistance. However, the efficacy of such a structure must be questioned for use as an analog signal switch because the long gate leads, and perhaps the source and drain leads, introduce added resistance which has a negative effect on the switching time and which increases power dissipation. Further, such a structure will take up area in a major surface when formed in a monolithic integrated circuit with no indication that the area is being consumed optimally.

Using up such area in a major surface of a monolithic integrated circuit is an expensive proposition. Experience has shown that the yield of operable integrated circuit chips from the fabricaiton process for a given monolithic integrated circuit is inversely proporational to the area of the major surface taken up by that monolithic integrated circuit. The cost, then, for a good monolithic integrated circuit chip is inversely proportional to the number of such chips formed in a wafer times the yield, with the result that the cost becomes proportional to the square of the area taken up in the major surface of the monolithic integrated circuit chip.

Thus, when considering the production of a monolithic integrated circuit chip, there is an extreme importance attached to the minimizing of the area of the major surface required therein. For field-effect transistor devices fabricated at a major surface of a monolithic integrated circuit, the minimization of the area of this major surface devoted to such field-effect transistor devices, for a given "on" channel resistance, is equivalent to minimization of the "on" condition channel resistance-device area product ($R_{on}A$). This is because the $R_{on}$ product ultimately determines the size of the monolithic integrated circuit chip major surface required to accommodate such field-effect transistor devices. Minimizing the field-effect device surface area used for a given "on" condition channel resistance also serves to minimize the gate area over the channel region, which improves switching speed by reducing both gate means resistance and the capacitances associated therewith.

FIG. 1C shows an alternative way to effectively increase the channel width while maintaining the channel length as small as possible. That is, rather than having a single long source, a single long drain, and a single long gate, there are provided multiple sources, drains, and gates repeated in a stripe effect pattern. This essentially represents dividing the structure of FIG. 1B several times and placing the resulting portions side by side.

Another geometrical layout which seeks to further reduce the $R_{on}A$ product beyond the reduction achieved by the structure of FIG. 1C is shown in U.S. Pat. No. 3,783,349 to Beasom. The Beasom reference discloses arranging rectangular or square source and drain regions in a semiconductor material body, separated by surfaces in the body major surface associated with gate portions, to form a grid or rectangular mesh arrangement having the sources and drain regions along intersections or centers of a grid pattern formed by sets of perpendicular lines. A portion of the essence of the pattern in the Beasom reference is repeated in FIG. 2 herein.

Source regions intersecting the surface of the semiconductor material body in FIG. 2 are again marked with S and by the numeral 10. The drain regions on the semiconductor material body are again marked with D and by the numeral 13. The portions of FIG. 2 associated with the gate regions are again marked with the letter G and by the numeral 16. Once again, the device of FIG. 2 is assumed to have an insulating layer over a semiconductor material body leading to the source and drain regions being shown in dashed lines. No interconnection means for the sources and drains are shown. Those portions of the source and drain regions which electrical contact would be made are shown by the solid line openings which are again marked by the numerals 11 and 14.

A further design geometry for this purpose is shown in U.S. Pat. No. 4,015,278 to Fukuta. In this situation, the sources are shown in the geometrical form of a letter "Y" while the drains are shown in geometrical form of a hexagon.

These alternative geometrical designs for field-effect transistors do indeed appear to aide in reducing the $R_{on}A$ product from the initially shown geometrical design layouts of FIGS. 1A and 1B for the various layout criteria. However, further improvements in the reduction of the $R_{on}A$ product are most desirable, especially where the field-effect transistor device is to be formed in a monolithic integrated circuit and be capable of controlling substantial currents therethrough without overheating the monolithic integrated circuit chip.

A further consideration for using a field-effect transistor in an analog switching situation is the ability thereof to withstand reverse bias voltages of substantial magnitude. That is, the device should have a substantial minimum punch-through voltage and a substantial minimum breakdown voltage. This is difficult to achieve, particularly for devices used in monolithic integrated circuits.

SUMMARY OF THE INVENTION

A field-effect transistor device is provided capable of withstanding a substantial reverse bias voltage by using semiconductor material source or drain region portions, or both, having dopant concentrations therein such as to permit depletion thereof under reverse bias before breakdown. Further, portions thereof involved in the gate region can serve to separate triangular areas formed in a densely packed matrix structures to provide a low "on" condition channel resistance.

BRIEF DESCRIPTION OF THE DRAWINGS

FIGS. 1A and 1B and 1C show field-effect transistor device source, drain and gate geometrical arrangements known in the prior art.

DESCRIPTION OF THE PREFERRED EMBODIMENTS

Figure 2:
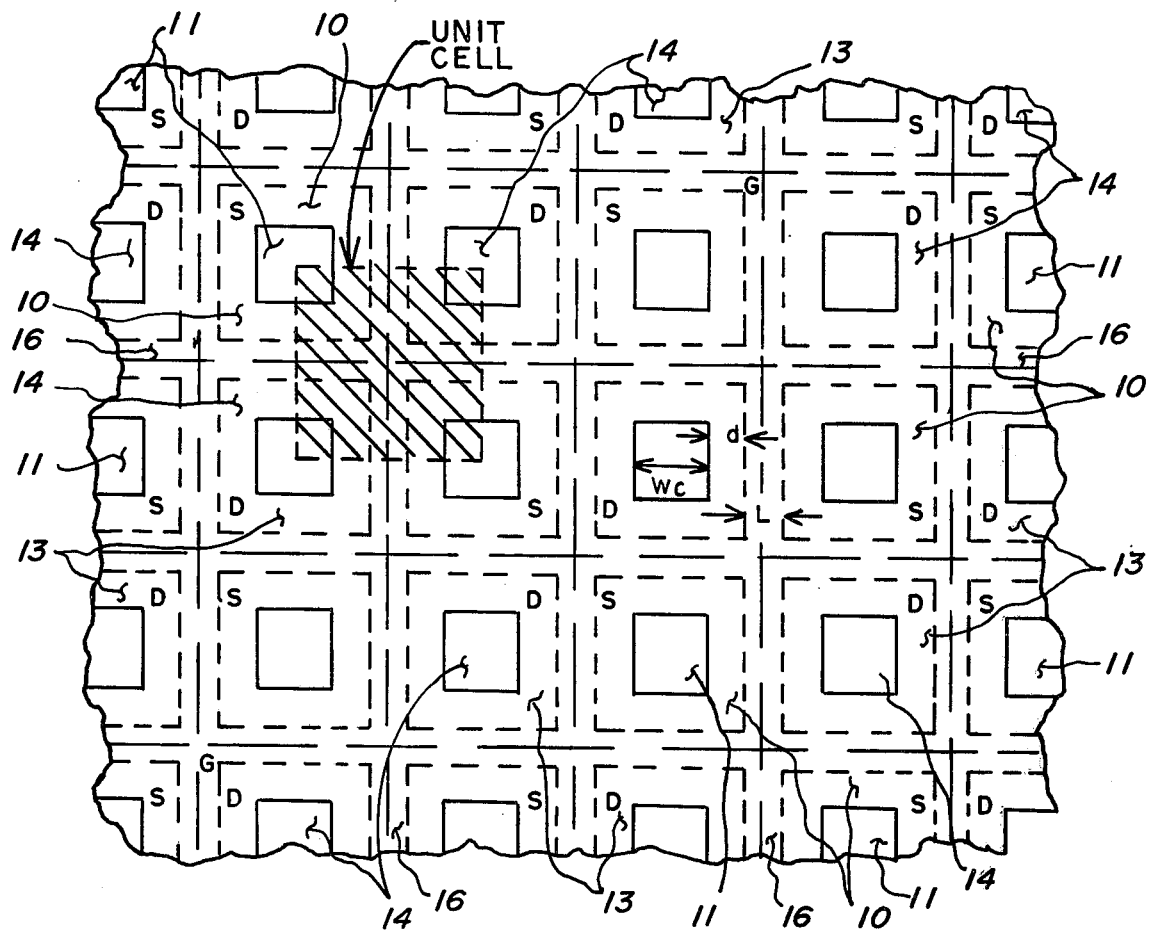
FIG. 2 shows a field-effect transistor device source, drain and gate geometrical arrangement known in the prior art.

The effect of the geometrical arrangement in the present invention of the source and drain regions in a field-effect transistor device for the purpose of decreasing the characterizing $R_{on}A$ product below that achieved in prior art structures can be shown by a mathematical model representing possible geometrical arrangements generally. Then, manipulation of that model may permit finding better geometrical arrangements. Understanding and attacking the problem of field-effect transistor device design for devices suitable for handling substantial power in a monolithic integrated circuit, or other small structure, in this manner does not appear to have occurred in the prior art and so the results are not found there either.

The problem of minimization of the $R_{on}A$ product of a surface field-effect transistor device has been found to be directly analogous to the problem of densely packing two-dimensional figures on a plane. This is so because the surface field-effect transistor device formed at the major surface of a semiconductor material body is essentially a two-dimensional device. That is, given a specific "on" condition channel resistance which must not be exceeded, minimize the area taken up by the geometrical arrangement of the field-effect transistor device in the major planar surface of the semiconductor material body containing the device.

The value for the effective channel length L, as earlier indicated, is to be kept as small as possible for reasons of aiding in minimizing both switching speed and "on" condition channel resistance minimization. The value of L finally chosen is, of course, subject to the construction of satisfying the design layout rules with regard to minimum spacings, as required by the process used to fabricate the field-effect transistor device, and of satisfying the minimum punch-through voltage requirement for the transistor when operated in the "off" condition. Thus, the value of L is not subject to being varied for the purposes of reducing device area leaving, as earlier indicated, the effective channel width w to be varied for these purposes. In these circumstances, the problem of minimizing the $R_{on}A$ product for the device can be restated as selecting the effective channel width w dimension necessary to obtain a satisfactorily small "on" condition channel resistance, and then minimizing the area of the resulting field-effect transistor device. Of course, the effective channel width w is subject to the same fabrication process dictated design layout rules mentioned in connection with channel length.

The layout shown in FIGS. 1A, B, and C is based on only the lowest order two-dimensional point symmetry group in the group theory of two-dimensional lattice geometrical figures. The geometrical arrangement shown in FIG. 2 makes use of a higher order point symmetry group, four-fold rotational symmetry.

However, from group theory, the problem above has as solutions the point groups, 2, 4mm, 6mm, and 2mm (i.e., geometrical figures possessing rotational symmetries of one-, two-, three-, four-, and six-fold). Since surface related field-effect transistor devices inherently possess a two-fold symmetry themselves, only those groups which can be decomposed into a two-fold and n-fold axis are actual solutions of the problem. Thus, not only are layouts possessing two-fold and four-fold rotational symmetry satisfactory solutions to the problem, but also layouts possessing six-fold rotational symmetry represent proper, densely packed device arrangement solutions. In practice, since one layer of metal must have a two-fold or lower symmetry, these layouts must be implemented with rectangles for the four-fold symmetry case, as shown for a device portion in FIG. 2, or with triangles for the six-fold symmetry case, a portion of which is shown in FIG. 3A.

The device portion shown in FIG. 3A again has source and drain regions, shown by dashed lines, formed in a semiconductor material body and intersecting a major surface thereof which surface supports an insulating layer. The intersection in the major surface of the source and drain regions provide densely packed triangular surface portions in the major surface. The triangular surface portions are shown as equilateral triangles which are preferred though not necessary. FIG. 3A again has the source regions 10 marked with an S. Drain regions 13 are again marked with a D, and finally, the gate regions 16 are again marked with a G. Small solid line triangles are shown where electrical contact would be made to the source and drain regions by the source interconnection means and the drain interconnection means, respectively.

Figure 3A:
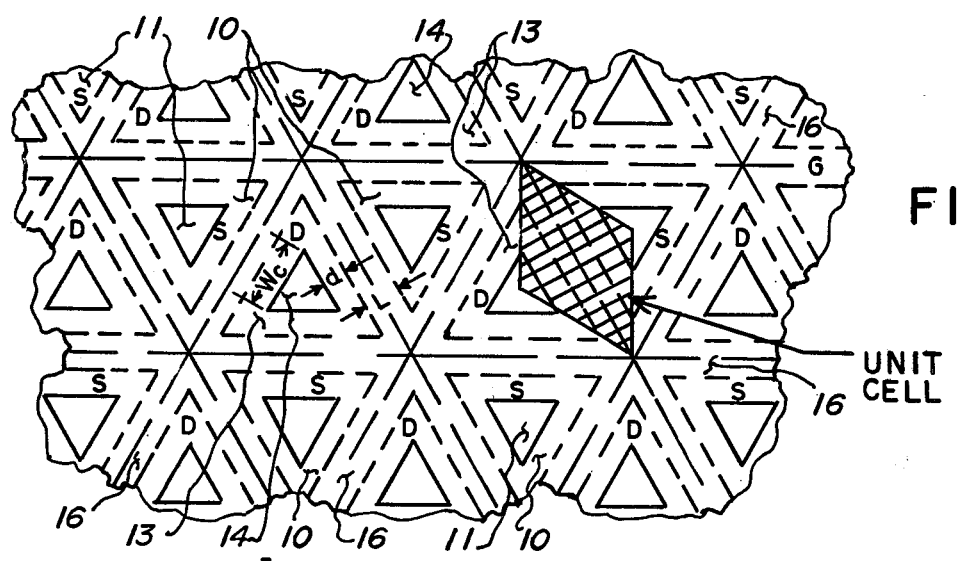
FIGS. 3A, 3B and 3C show various field-effect transistor device source, drain and gate geometrical arrangements of the present invention.

The long dashed lines along the separating surfaces between the source and drain triangular surface portions, forming the mesh network in the triangular mesh associated with the gate in FIG. 3A, provide extended triangles around each of the triangular surface portions representing a source or a drain. These extended triangles include an associated part of the gate mesh with each source and drain triangular surface portion. When these larger triangular surface portions are considered in relation to one another, the extended triangles (shown here as equilateral triangles just as are the triangular surface portions of the source and drain regions) make clear the six-fold rotation symmetry in forming a densely packed hexagonal matrix structure. Similarly, long dashed lines have been added in FIG. 2 to form extended quadrilateral surfaces, actually squares, in the rectangular mesh, or square mesh, shown there. These larger square portions make clear the four-fold rotational symmetry in forming a densely packed rectangular matrix structure.

To determine the relative merits of the various layouts possible within the bounds of the group theoretical solutions indicated above, the RA product must be evaluated for each. To do so, the assumption is made that each field-effect transistor device associated with an evaluated layout will be operating in the linear region at small values of drain to source voltage, $V_{DS}$. The well-known equation for the "on" condition channel resistance for a MOSFET, as an example, is given by the following expression:

$$R_{on} = \frac{L_{eff}}{w_{eff}\mu C_{ox}(V_{GS} - V_T)}$$

The meanings of the symbols used in the foregoing equation are the following:

$R_{on} \triangleq$ "on" condition channel resistance.
L $\triangleq$ channel length.
$W_{eff} \triangleq$ effective channel width.
$C_{ox} \triangleq$ capacitance per unit area of gate-oxide capacitor.
$\mu \triangleq$ mobility of channel carriers.
$V_{GS} \triangleq$ gate to source voltage.
$V_T \triangleq$ threshold voltage.

To proceed with the analysis, the $R_{on}A$ product is now found by first substituting for $w_{eff}$ in the foregoing equation, the value obtained therefor from the unit cell in each of the layouts shown in FIGS. 1C, 2, and 3A which represent the layout solutions found within the bounds of the group theory set out above. The unit cells in these three figures each represent the associated minimum dimension basic cell for each of the layouts therein, respectively, as determined by the group theory used. Finding the $R_{on}A$ product for the layout in each of FIGS. 1C, 2, and 3 is then completed by multiplying the associated version of the foregoing equation—now containing the appropriate substitution for $w_{eff}$—by the area of the corresponding unit cell.

The following equations are obtained for the geometrical arrangements shown in FIGS. 1C, 2 and 3:

$$(R_{on}A)_{FIG. 1C} = \frac{L(L + w_c + 2d)}{\mu C_{ox}(V_{GS} - V_T)}$$

$$(R_{on}A)_{FIG. 2} = \frac{L(L + w_c + 2d)}{\mu C_{ox} 2(w_c + 2d)(V_{GS} - V_T)}$$

$$(R_{on}A)_{FIG. 3A} = \frac{2(3)^{\frac{1}{2}}L[\frac{w_c}{2(3)^{\frac{1}{2}}} + d + \frac{L}{2}]^2}{\mu C_{ox}[w_c + 2(3)^{\frac{1}{2}}d](V_{GS} - V_T)}$$

In these equations, $w_c$ represents the width of the electrical contact made by the interconnection means to each of the source and drain region major surface portions, while d represents the minimum required spacing between the electrical contacts and the edge of the channel in each of the source and drain region major surface portions.

The meaning of the last three equations resulting for the $R_{on}A$ products of the layouts in FIGS. 1C, 2, and 3A can be seen by comparing the equation values when a defined parameter representing the effective channel width per source or drain region, $(w_c + 2d)$, is varied with respect to the effective channel length L. In the limit where the channel width parameter is much greater than the channel length, i.e. $(w_c + 2d) >> L$, the $R_{on}A$ product representing the perpendicular lines-of-centers grid of FIG. 2, $(R_{on}A)_{FIG. 2}$, approaches being one half of the $R_{on}A$ product for the repeated stripe geometry of FIG. 1C, $(R_{on}A)_{FIG. 1C}$ for identical values of $w_c$, d, and L. On the other hand, the $R_{on}A$ product for the triangular mesh of FIG. 3A, $(R_{on}A)_{FIG. 3A}$, shows the improvement achieved by the present invention is being but a third of that for the repeated stripe layout geometry of FIG. 1C. To restate, the following results are obtained in the desired situation of using as short as possible channel lengths:

$$(R_{on}A)_{FIG. 2} \rightarrow 0.50(R_{on}A)_{FIG. 1C}, (w_c + 2d) >> L$$

$$(R_{on}A)_{FIG. 3A} \rightarrow 0.33(R_{on}A)_{FIG. 1C}, (w_c + 2d) >> L$$

For the same equations, when $(w_c + 2d)$ is approximately equal to L the RA products for all three of the layouts of FIGS. 1C, 2, and 3A are nearly equal. Finally, when $(w_c + 2d)$ is much less than L. the layout of FIG. 1 turns out to have the lowest $R_{on}A$ product.

Figure 4:
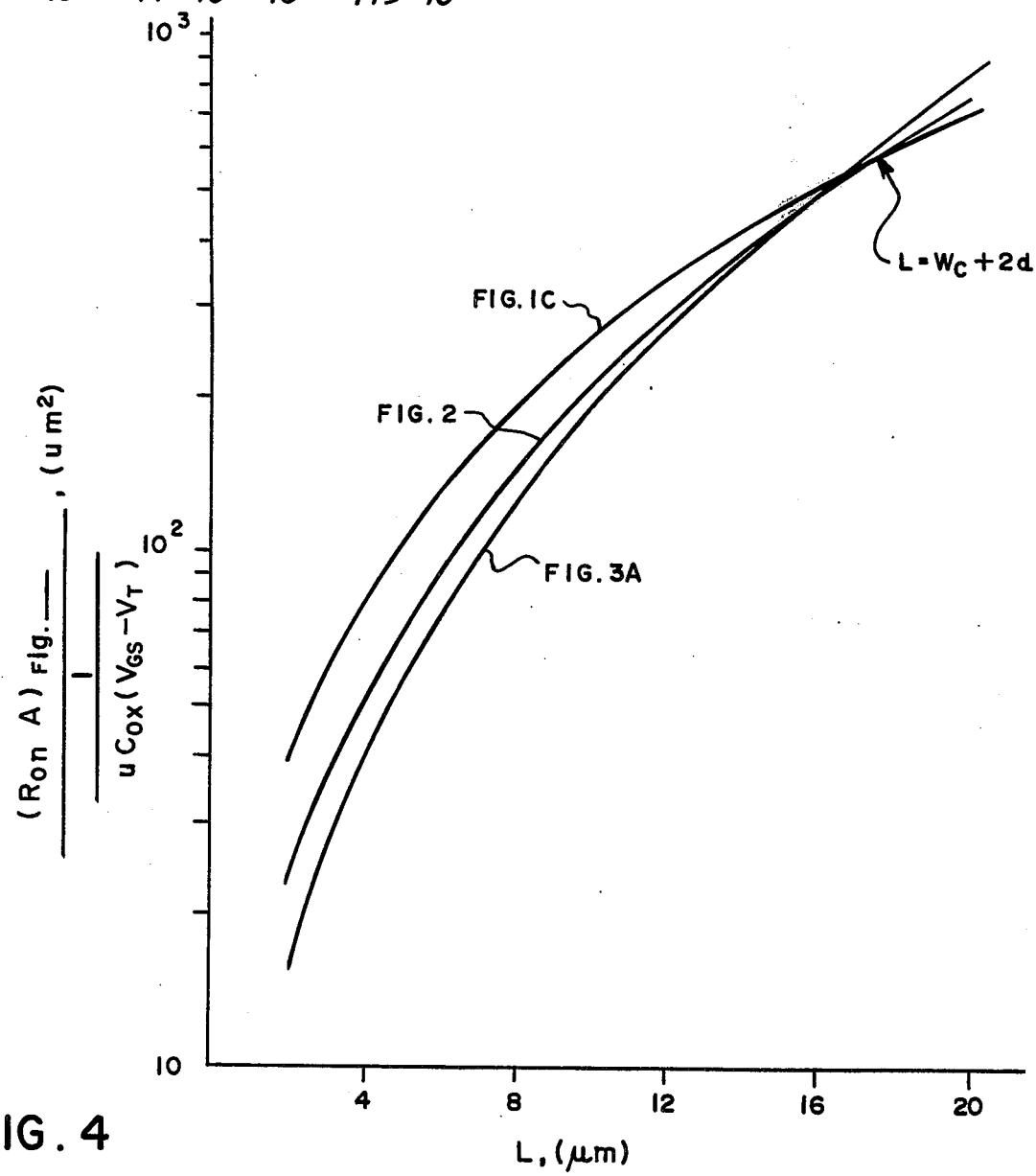
FIG. 4 shows a graph of the "on" condition channel resistance-device area product versus channel length for three field-effect transistor device source, drain and gate geometrical arrangements.

This relationship is shown by the graph in FIG. 4 where the $R_{on}A$ product for each of the layouts in FIGS. 1C, 2, and 3A are plotted as a function of channel length L. The $R_{on}A$ product has been normalized by the factor $\mu C_{ox}(V_{GS} - V_T)$ and the assumption has been made that the layout rules permit $w_c = 5\mu m$ and $d = 6\mu m$. The result shown by these equations in FIG. 4 is that the triangular mesh, i.e. the densely packed hexagonal matrix structure of FIG. 3A, has the smaller $R_{on}A$ product when the channel length becomes relatively small, a situation indicated above to be most desirable. This is, of course, achieved with the size of the source and drain regions having been chosen no more than reasonably large enough to meet the limitations in the fabrication process typically used in manufacturing monolithic integrated circuits.

Of course, since monolithic integrated circuit layout rules for minimum spacings will tend to dictate the relative minimum size of each unit cell for each of the layouts in FIGS. 1C, 2, and 3A, practical layouts may not be able to achieve the full potential reduction in the RA product for a given one of these symmetry group solutions to the minimization problem above. Thus, there is a possibility, for instance, that the four-fold symmetry group represented in the FIG. 2 layout might possess a lower $R_{on}A$ product in practice than does the six-fold symmetry group structure represented in FIG. 3A, even for a relatively small channel length, despite the relationships of FIG. 4. Thus, necessarily, any relative result among the foregoing solutions must be examined by a simulated or an actual test structure before choosing among them.

For instance, the foregoing analysis of the FIGS. 1C, 2, and 3A arrangements has proceeded on the assumption that, in each instance, the interconnection means for electrically interconnecting the source and drain regions can be ignored in the analysis. If this is not the case, possibly because the minimum spacing rules might require, for one layout as opposed by the others, an interconnection means, having relatively thin leads therein leading to a relatively high interconnection means resistance. Then the relative merits of two layouts, such as the FIGS. 2 and 3A layouts, might be just reversed from that concluded in the above analysis. However, in both theory and practice, the triangular mesh layout of FIG. 3A has proved to have a smaller surface area in the monolithic integrated circuit for a given "on" condition channel resistance than does the perpendicular lines-of-center grid layout of FIG. 2. In fact, the interconnection means resistance can even be relatively lower in the triangular mesh layout of FIG. 3A than in the perpendicular lines-of-center grid layout of FIG. 2.

Figure 5:
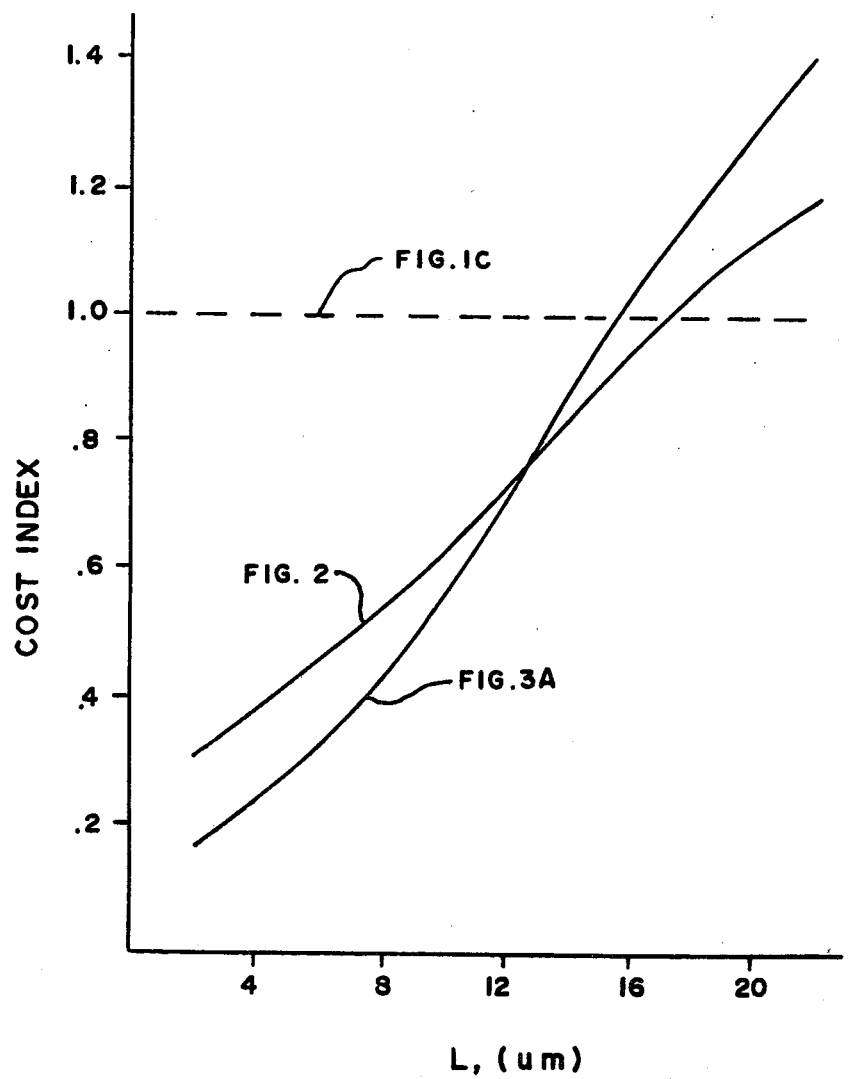
FIG. 5 shows a graph of estimated relative costs of three field-effect transistor device source, drain and gate geometrical arrangements.

Earlier, the relationship was noted that cost was typically proportional to the square of the area taken up in the major surface in a monolithic integrated circuit. FIG. 5 shows a plot of relative costs in terms of indices, the plot being made on the basis of the repeated stripe layout of FIG. 1C being the base cost. Note that the selection of the least cost layout clearly depends on the channel length chosen in connection with a particular layout for fixed values of $w_c$ and d. For a channel length of 7.5 $\mu m$, the perpendicular lines-of-centers grid of FIG. 2 can be expected to cost approximately 50% of the cost of the repeated stripe layout of FIG. 1C while the triangular mesh layout would be expected to cost but 37% of the FIG. 1C layout. Again, these costs assume that analysis used in the above equations is not compromised in practice by layout rules leading to relatively high resistance interconnection paths for one layout as opposed to the other.

Figure 3B:
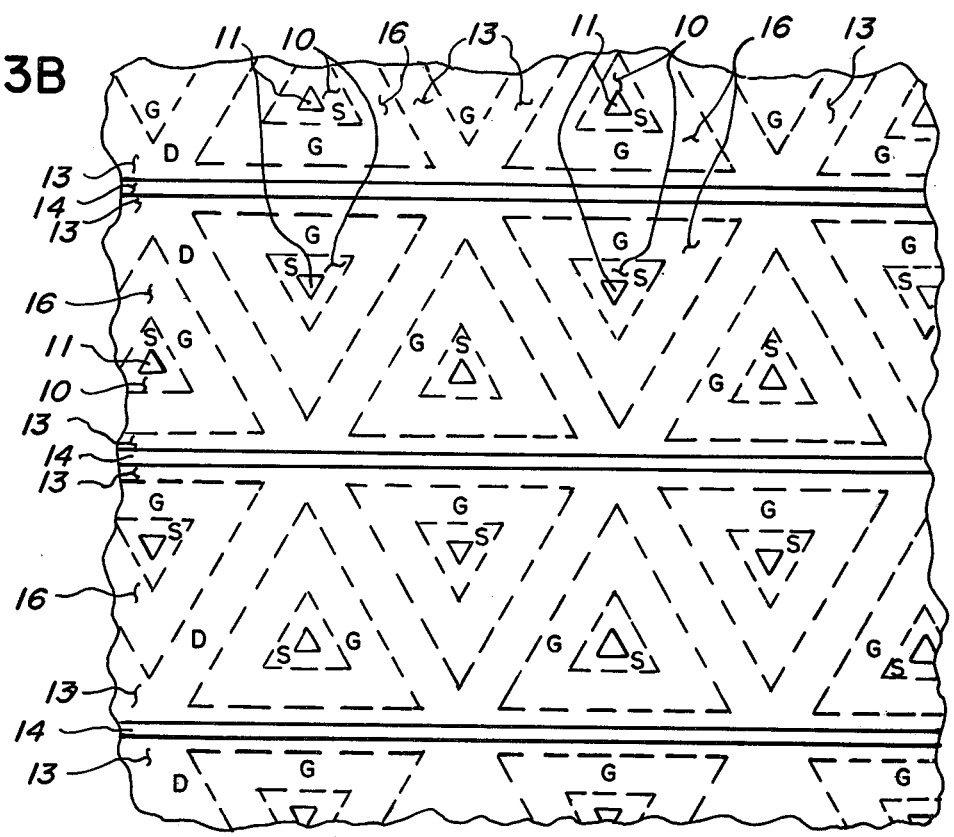

An alternate field-effect transistor device, also based on use of a densely packed hexagonal matrix structure, is shown in FIG. 3B. This version can also provide a both low "on" condition channel resistance and a low resistance in the metallization runs of the source and drain interconnection means, respectively. Further, the metallization shown in FIG. 3B can be provided in the pattern shown more easily than the pattern for the version shown in FIG. 3A in at least some metallization processes.

In the arrangement of FIG. 3B, the source region triangular surface portions 10 are within, and coincide with, the triangular gate surface portions 16. The drain region mesh surface portions 13 form a mesh pattern having triangular openings wherein the source and gate region surface portions are contained. Thus, latter regions are densely packed in a hexagonal matrix structure in the surface of the device shown in FIG. 3B, where the regions just mentioned are provided below a passivating layer covering the device.

FIG. 3B has source regions 10 again marked with a S and drain region 13 again marked with a D. Finally, gate regions 16 are again marked with a G. The solid line, and smallest, triangles represent openings in the insulating layer where electrical contact would be made to source regions 10 by the source interconnection means. The parallel solid lines define openings in the insulating layer where electrical contact would be made to drain region 13 by the drain interconnection means. A further layer of interconnection means is required to electrically interconnect gate regions 16. Openings for such connections are not shown in FIG. 3B.

Figure 3C:
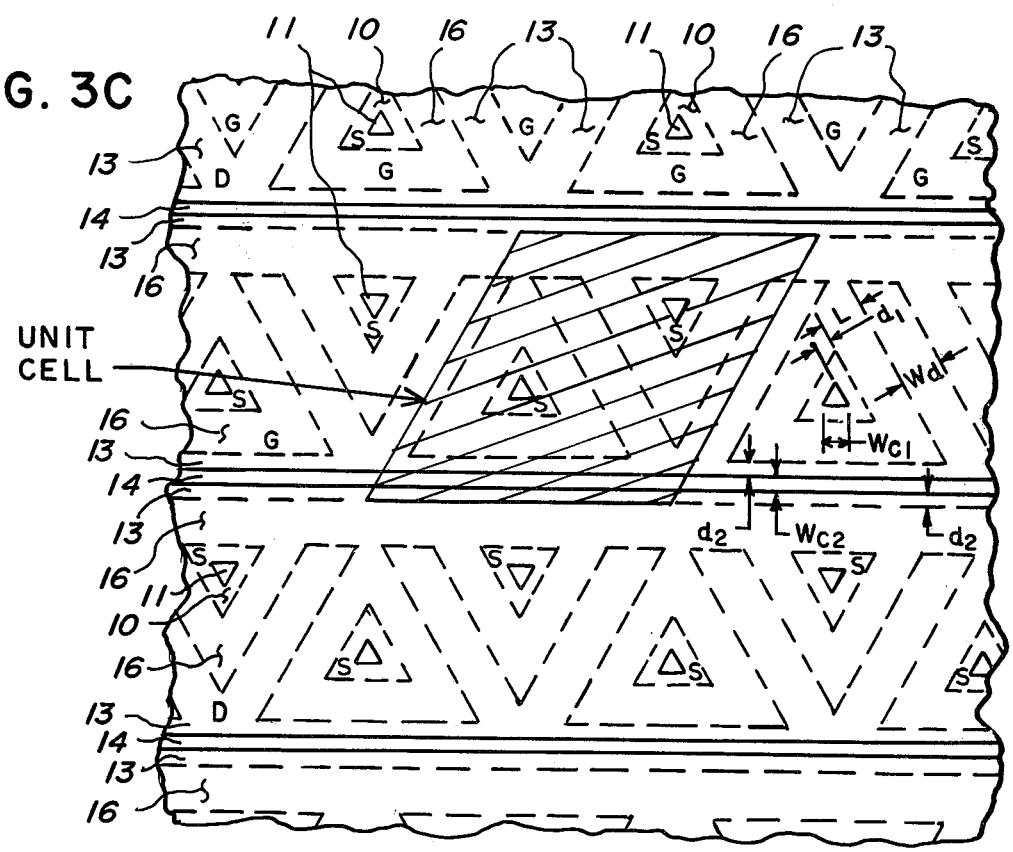

To avoid needing another interconnection means layer for electrically interconnecting the separated gate regions shown in FIG. 3B, the structure of FIG. 3C can be used to join, in the semiconductor material, the gate regions around the source region to thereby form a plurality of rows of joined gate regions. This provides the possibility of a single contiguous gate region in the semiconductor material if these rows are also joined in the material, or if not, at least no gate interconnections are required beyond those needed for interconnecting the rows. Other than the interconnecting of gate regions 16 in the semiconductor material in FIG. 3C, the structure shown in this figure is substantially that shown in structure in FIG. 3B.

The choice of what is designated as source regions 10 in FIGS. 3B and 3C--the region having triangular surface portions--as opposed to choosing drain regions 13 to have triangular surface portions is arbitrary. That is, the regions 13 marked with a D and the regions 10 marked with a S could have these markings interchanged so that the drain regions are the triangular surface portions and so that the source regions form a mesh surface portion surrounding the gate and drain triangular surface portions, respectively.

Choosing the structure shown in FIG. 3C for analysis, a unit cell has been shown there of the same nature and in the same manner as the unit cells shown in each of FIGS. 1C, 2, and 3A. The $R_{on}A$ product for the layout of FIG. 3C then is given as follows:

$$(R_{on}A)_{FIG.\ 3C} = \frac{L[3L + 3d_1 + 2d_2 + \frac{(3)^{\frac{1}{2}}}{2} w_{c1} + w_{c2}]}{\mu C_{ox} 6[2(3)^{\frac{1}{2}} L + 2(3)^{\frac{1}{2}} d_1 + w_{c1}](V_{GS} - V_T)} \cdot [2(3)^{\frac{1}{2}} L + 2(3)^{\frac{1}{2}} d_1 + w_{c1} + \frac{4}{(3)^{\frac{1}{2}}} w_d] \cdot$$

In these equations L again represents the distance across the gate region while $w_d$ represents the width across the drain region arm. The symbols $w_{c1}$ and $w_{c2}$ are the contact opening dimensions for source regions 10 and drain regions 13, respectively. The distances $d_1$ and $d_2$ represent distances remaining in the source and drain regions outside the associated contact openings, respectively.

If the analysis of this last equation is pursued, one finds that the performance of the structure in FIG. 3C is approximately that of the structure shown in FIG. 3A with respect to the performance of the structure shown in FIG. 1C. Hence, the densely packed hexagonal matrix structure of FIG. 3A is approximately equal in the device performance to the structures shown in FIGS. 3B and 3C.

Figure 6:
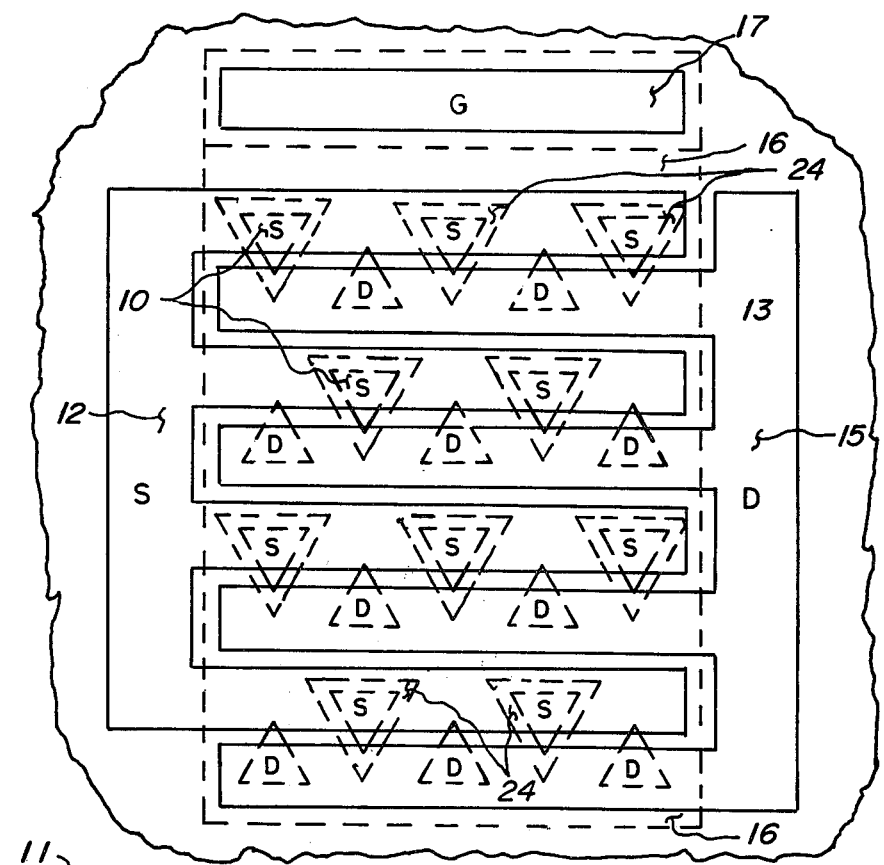
FIG. 6 shows a field-effect transistor device of the present invention.

FIG. 6 shows a top view of a field-effect transistor device of the present invention, related to FIG. 3A, without a passivating layer present over the source and drain interconnection means. Although the triangular surface portions resulting from the intersection in the semiconductor material body major surface of several source and drain regions are shown in FIG. 6, the few shown there should not necessarily be taken as being indicative of the number of source and drain regions which will be provided in the actual usable device. Rather, the number presented reflect the size which can be conveniently accommodated in the drawing. In actual use, there will usually be thousands of such triangular surface portions, often exceeding 50,000 in number.

The source interconnection means 12, typically formed with aluminum metal, is marked with a S as found in FIG. 1A. The drain interconnection means 15, again typically aluminum metal, is marked with a D as is also true in FIG. 1A.

The gate contact opening, 17, is marked with a G. The extension from gate contact opening 17 over the gate portions of the field-effect transistor device is again designated by 16, as in FIG. 1A, and includes the entire dashed line rectangle so marked but substantially excluding those portions over the triangular surface portions involving the source and drain regions. In a JFET, region 16 represents portions of the semiconductor body material which are of a conductivity type opposite that found in the source and drain regions. Region 16 could also be, in this instance, a conductor over, and making contact to, such JFET gate regions used when the gate resistance is to be minimized. In a MOSFET, region 16 represents gate conductive material on an underlying insulating layer, usually silicon dioxide, which separates the semiconductor material body and the gate conductive material layer 16. Typically, in this instance, the region 16 gate conductive material is either of polysilicon or of metal. Polysilicon would be chosen for the most compact design because the layout spacing rules can be tightened because there is less chance with polysilicon of shorts to the overlying metal layers involving the source and drain interconnection means. However, a metal for gate 16 would be chosen when fast switching speed is the primary desire because there is less lead resistance when metal is used therefor.

The triangular surface portions 10 in the major surface of the semiconductor material body due to the intersecting source regions, shown under a silicon dioxide insulating layer, are again each marked with a S in FIG. 6 as the source region was in FIG. 1A. The triangular surface portions 13 due to the drain regions are each marked with a D as was the drain region in FIG. 1A. A further passivating layer, typically of doped silicon dioxide, would also be provided over the structure shown in FIG. 6 but has been omitted here for clarity.

Figure 7:
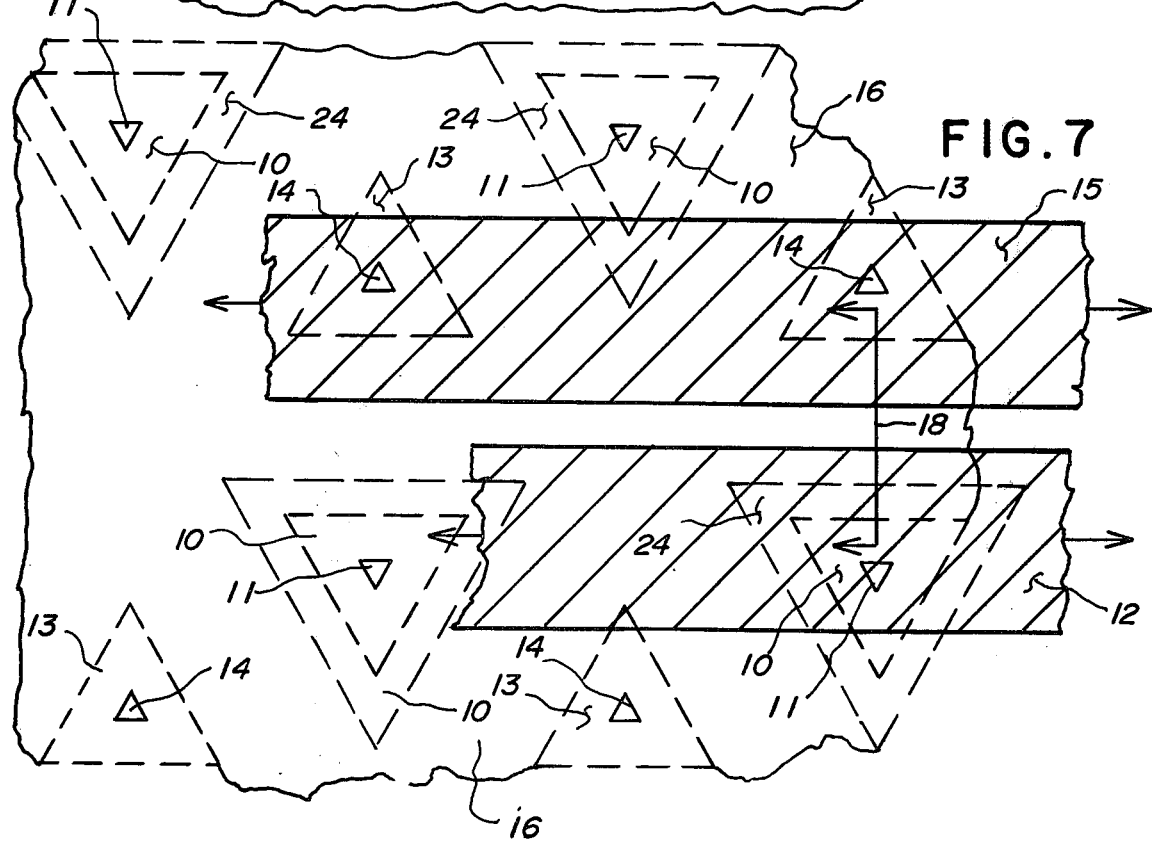
FIG. 7 shows a portion of the field-effect transistor device of FIG. 6.

The portion of FIG. 6 contained in the closed wavey line is shown again, for the most part, in FIG. 7 for a MOSFET device. The same numeral designations are retained in FIG. 7 as have been used in FIG. 6. Contact cuts through the insulating layer disposed between the source and drain interconnection means and the semiconductor material body to accommodate electrical contacts to the source and drain regions below by these interconnection means are shown on FIG. 7. These contact cuts are identified in FIG. 7, as they were in FIG. 1A, as source contact cuts 11 and drain contact cuts 14.

Figure 8:
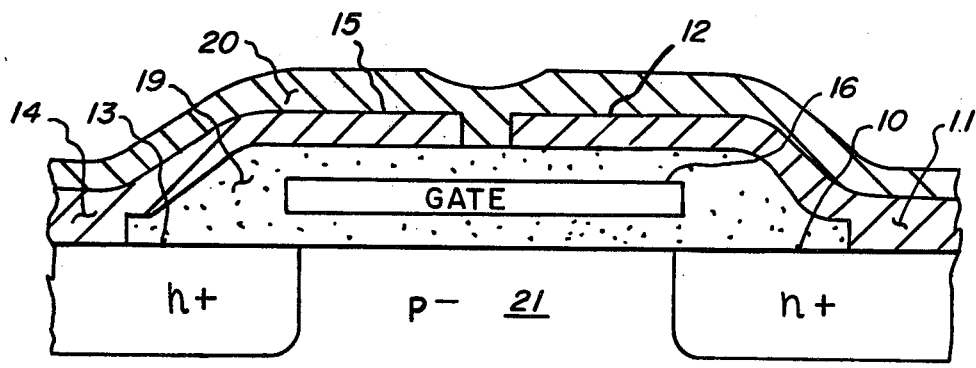
FIG. 8 shows a cross section of a portion of one version of the field-effect transistor device of FIG. 7.

A section line, 18, is shown in FIG. 7 and the corresponding section portion is shown in FIG. 8. Again, the same numerals have been retained in FIG. 8 as were used in FIGS. 6 and 7. A phosphosilicate glass passivating layer, 20, has been added in FIG. 8 which is not present in FIGS. 6 and 7. A silicon dioxide insulating region, 19, protects the gate and separates it from the semiconductor material body major surface.

The n-type conductivity drain region associated with the triangular surface portion 13 is typically provided by a phosphorus dopant through diffusion or implantation in the silicon semiconductor material body, 21, where the dopant reaches the concentration of approximately $10^{18}$ atoms/cm$^3$. The source region associated with surface portion 10 is similarly provided. The semiconductor material body outside of the source and drain regions is typically of p-type conductivity due to a boron dopant therein to the extent of approximately $2 \times 10^{15}$ atoms/cm$^3$. A typical spacing between the source and drain regions, as indicated earlier, would be 7.5$\mu$m. A typical separation between the semiconductor material body in 21 and the gate would be 1,000Å.

An MOS device can be built somewhat differently than shown in FIG. 8 by having the gate 16 remain as shown but having the source region 10 and the drain region 13 provided by a doped polysilicon deposition on the major surface of the semiconductor material body immediately adjacent the gate. In this situation, there would not be substantial doped regions provided in the semiconductor material body to serve as source and drain regions.

Figure 9:
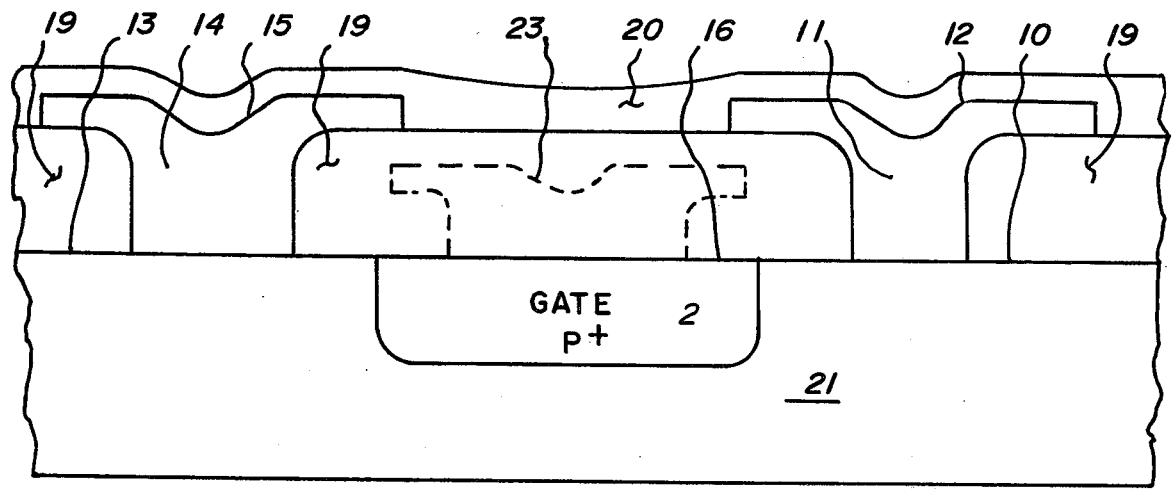
FIG. 9 shows the cross section of a portion of another version of the field-effect transistor device of FIG. 7.

FIG. 9 shows the JFET configuration corresponding to FIGS. 6 and 7, again retaining the same numeral designations for common or similar structural portions. Now, however, the semiconductor material body 21 represents an n-type conductivity silicon epitaxial layer doped with $10^{15}$ atoms/cm$^3$ of phosphorus, formed over a p-type conductivity silicon substrate, 22, doped with $5 \times 10^{14}$ atoms/cm$^3$ of boron. Layer 21 contains the source and drain regions forming the triangular surface portions at its major surface. These source and drain regions partly surround the gate region 16 so that then drain and source regions are continuous below gate region 10, i.e. are contiguous with one another. Gate region 16 is formed by doping with boron to the extent of $10^{18}$ atoms/cm$^3$.

Another layer of metal, 23, is shown in FIG. 9 by dashed lines as a gate electrical connector to the gate region 16 surface which, in ohmic contact with the surface of region 16, could alternatively be used to reduce gate resistance rather than using the gate region in the semiconductor body as the sole gate interconnection means. If the region in layer 21 serving as the gate region were eliminated, metal layer 23 in rectifying contact with layer 21 would serve to define the gate region 16 in a Schottky barrier field-effect transistor device.

As indicated in the foregoing, a desirable field-effect transistor device will not only have a low "on" channel resistance, but also, the device must be able to stand a substantial voltage between the effective drain and the effective source, (punch-through voltage) and between the effective drain and the substrate (breakdown voltage), when the device is in the "off" condition. This is particularly true for field-effect transistor device used as switches or controllers in power circuits involving substantial voltages.

To obtain a substantial punch-through voltage capability, one could, of course, increase the effective channel length of the device. However, this has substantial disadvantages, as indicated above, in connection with the "on" condition channel resistance and the switching speed. Further, this expedient does little to improve the breakdown voltage across the drain-to-substrate pn junction. This breakdown voltage is affected by the doping levels occurring in the source and drain regions partly which determines the immobile charge electric field contribution to breakdown, and by the resulting geometrical shapes of these regions in that curvature thereof can significantly increase the effective electric field for a given potential to thereby hasten the onset of breakdown.

Further, the gate region can considerably modify the punch-through and breakdown voltages from what they would be in the absence of this gate region. These modifications are due to such phenomena as hot carrier injection into gate insulating layers, concentration of surface field lines by the conductive gate, anamolous surface conduction under the gate, etc.

Figure 10:
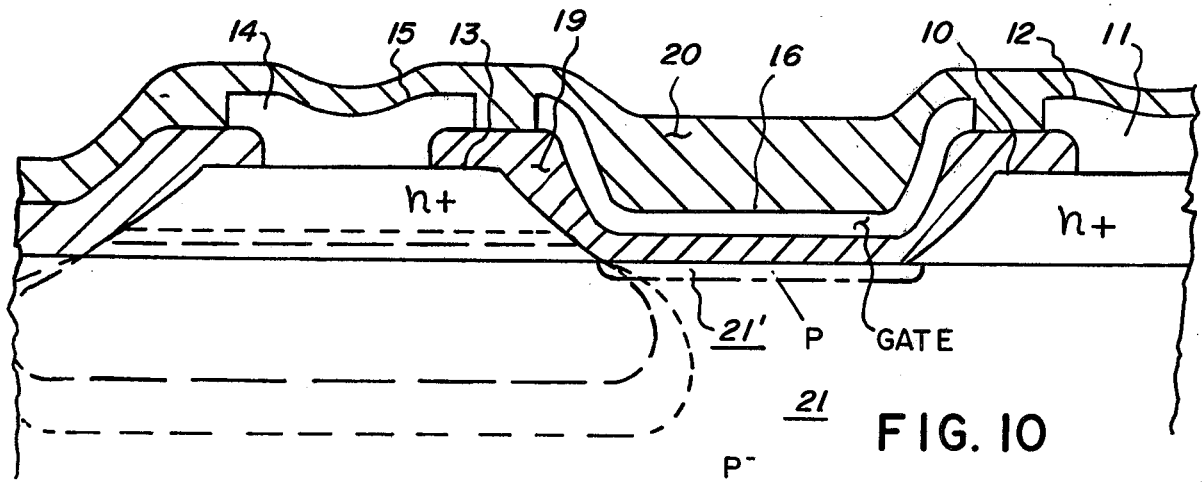
FIG. 10 shows a cross section of a portion of a version of the field-effect transistor device of the present invention that can withstand a substantial reverse bias voltage.

FIG. 10 shows a MOS device structure alleviating the punch-through voltage and breakdown voltage problems. The device of FIG. 10 is to be taken as representing the cross section of either an individual MOS field-effect transistor device of a field-effect transistor device having multiple sources and gates. In this latter instance, FIG. 10 is thus a somewhat wider version of cross section 18 of FIG. 7, a FIGURE taken from part of FIG. 6 and related to FIG. 3A. Passivating layer 20 has been added in FIG. 10 as in FIGS. 8 and 9 which also show cross sections taken from FIG. 7.

In FIG. 10, however, the source and drain region leading to triangular surface portions 10 and 13, respectively, are no longer formed in the semiconductor material body, but rather are formed on the major surface of the semiconductor material body by deposits of doped polysilicon. The channel of the MOS field-effect transistor device of FIG. 10 will again occur in the semiconductor material body 21 through inversion occurring in this semiconductor material below the gate 16. This channel will then form between the source and drain doped polysilicon deposits.

The silicon semiconductor material body 21 is of p-type conductivity through being doped by boron atoms to the extent of approximately $2 \times 10^{15}$ atoms/cm$^3$. A threshold voltage adjust region, 21', of higher boron doping at the body 21 major surface, typically $2 \times 10^{16}$ atoms/cm$^3$ may be provided, usually by implantation, to adjust the threshold voltage of the resulting field-effect transistor. This region may also be selected to be provided in some of the previously discussed devices. The polysilicon source and drain regions leading to the triangular surface portions 10 and 13, respectively, (in the multiple source and drain region device laid out in a hexagonal matrix densely packed structure of FIG. 10), are of n-type conductivity through doping by phosphorus to the extent of $10^{18}$ atoms/cm$^3$. The gate 16 can again be of doped polysilicon or of metal. The doped polysilicon drain and source regions are typically 0.3 to 0.4$\mu$m thick and separated by typically 4$\mu$m. The tapered portions of these regions are at least 1μm in extent along the surface of semiconductor layer 21, and preferably 2μm. Silicon dioxide layer 19 is typically 2,000Å. Other parameter voltages are possibly subject to the criteria discussed below.

Of course, the FIG. 10 cross section can also represent either a discrete field-effect device or one in a monolithic integrated circuit having other transistors or types of transistors therein. This device could also be used in connection with the layout of FIG. 1, 2, 3B or 3C in a monolithic integrated circuit as well as with the layouts of FIGS. 3A, 6, and 7.

When in the "off" condition, a substantial positive voltage, i.e. reverse bias voltage, will be on drain region 13 leading to the depletion regions outlined by the dashed lines in FIG. 10. A smaller reverse bias voltage provides the depletion region contained within the long dashed lines in FIG. 10 and a larger reverse bias voltage leads to the larger depletion region contained within the short dashed lines. First, the structure of FIG. 10 will increase the minimum voltage leading to punch-through between the depletion regions around both drain region 13 and source region 10, respectively, resulting from the merging of these depletion regions. This is because of the abrupt nature of the boundary or edge of doped polysilicon drain region 13 at its terminating edge next to the channel which requires that the depletion region portion in the semiconductor material layer 21 to begin essentially at this edge to maintain equal immobile charge on both sides of the metallurgical junction in the depletion region.

This equal charge maintenance requirement and the relatively long extent of relatively heavily doped source region 13 also means that increases in the depletion region extent with increasing reverse bias voltage will occur mostly perpendicular to the surface of semiconductor material layer 21 with very little increase parallel thereto. That is, any increase in the depletion region extent perpendicular to the surface of semiconductor material layer 21 will include so much more immobile charge to balance the added immobile charge in the depletion region occurring in drain region 13 that little further increase in the layer 21 depletion region parallel to its surface is required. Further, any increase in the depletion region extent in drain region 13 occurrs in a portion thereof relatively remote from the boundary thereof because of the tapered edge nature of this source region. The source region 10 is usually of similar construction.

Not only is there an improvement in the minimum punch-through voltage in using the structure of FIG. 10, but also there is an improvement in the breakdown voltage of the pn junction between the doped polysilicon drain region 13 and the semiconductor material body 21 serving as a substrate. This improvement in the breakdown voltage depends directly on the length and thickness, i.e. the taper, of the tapered edge of the drain region 13 as shown in FIG. 10. If the terminating edge of drain region 13 were a planar boundary perpendicular to the surface of semiconductor material layer 21, there would be a relatively sharp angle in the depletion region boundary at the point the doped polysilicon deposit of drain region 13 meets this surface because of the extension, though smaller, of the depletion region in layer 21 parallel to this surface. Such an abrupt geometrical change in the depletion region leads to a relatively high gradient of the voltage being dropped across the depletion region at the point of the sharp change which means a relatively high electric field at this point for a given voltage leading to a relatively low breakdown voltage. On the other hand, drain region 13 with its tapered terminating edge does not introduce a sharp angle into the depletion boundary and so no substantial gradients result. Thus the breakdown voltage is not too different from that associated with a plane junction.

A further advantage of the structure shown in FIG. 10 is that the edge of the depletion region in drain region 13 comes out from beneath effective portions of gate 16 for large reverse bias voltages on drain region 13. This leads to higher breakdown voltages by eliminating or reducing some of the problems described above in connection with the mention of the gate modifying breakdown voltages. Thus, the doping distributions in the polysilicon deposit of drain region 13 and of semiconductor material layer 21, the extent of the tapered portion of drain region 13 under effective portions of gate conductor 16, and the thickness of gate insulating layer 19 should be chosen so that the drain depletion region extends through those portions of drain region 13 under the effective portions of gate conductor 16 prior to breakdown occurring.

The structure of FIG. 10 allows the use of any crystallographic plane as a major surface of semiconductor body 21 so that a high carrier mobility in that particular crystallographic orientation can be obtained. This is in contrast to V-MOS devices where the need for etching the V-groove limits the crystallographic orientations which can be used and results in crystallographic orientations for the channel that have a lower carrier mobility and, hence, higher "on" condition resistance and longer switching time.

The structure of FIG. 10 can be provided with use of simple processing requiring no high temperature steps since no diffusions are involved. That is, the doped polysilicon can be deposited by an evaporation process without any need for high temperatures and there is no other doped regions to be provided in or upon the already doped semiconductor material 21.

The cross sections shown in FIGS. 8, 9, and 10 would be approximately the same, if properly chosen, for figures related to FIGS. 3B and 3C as FIGS. 6 and 7 are related to FIG. 3A. That is, the change in geometrical arrangement in going from FIG. 3A to FIGS. 3B or 3C would not require substantial fabrication process changes.

Figure 11:
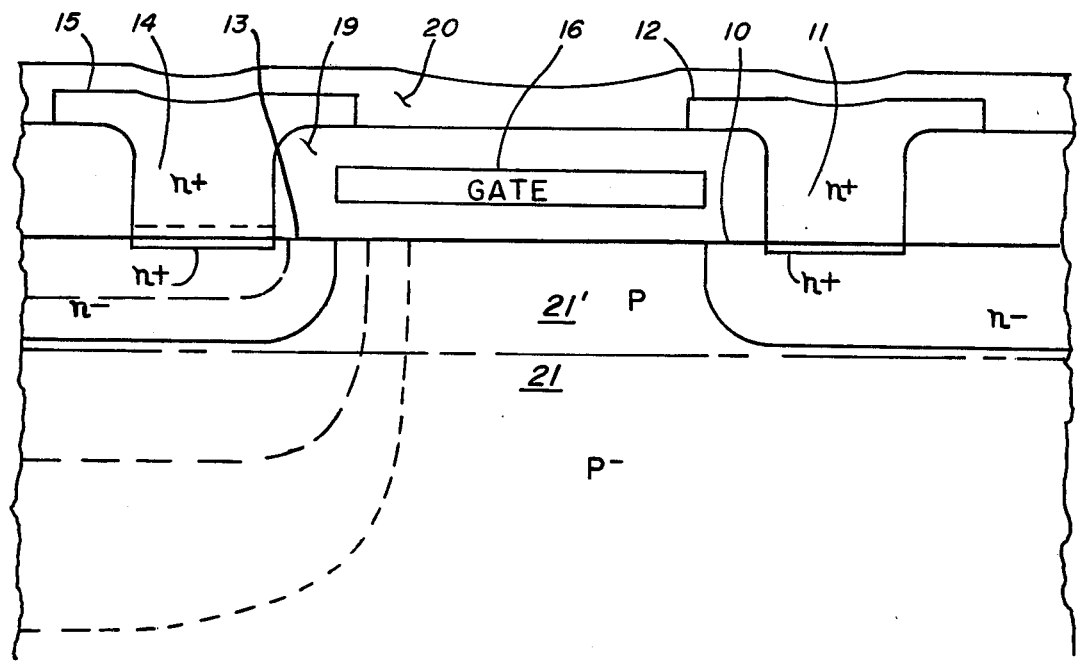
FIG. 11 shows a cross section of a portion of another version of the field-effect transistor device of the present invention that can also withstand a substantial reverse bias voltage.

The structure of FIG. 10 requires the doped polysilicon source region 10 and drain region 13 have a tapered termination edge spread—to a distance of one and preferably two microns—over a substrate structure, a situation which can present difficulties in fabrication for some fabrication processes. FIG. 11, on the other hand, shows an alternative MOS field-effect device which also provides high minimum punch-through and breakdown voltages. The structure of FIG. 11 is again to be taken as representing a cross section of either an individual MOS field-effect transistor device or of a portion of a MOS field-effect device having several source and drain regions. Thus, again, the FIG. 11 cross section can be a wider version of cross section 18 in FIG. 7 if a passivating layer was added in this latter Figure, and so of FIGS. 6 and 3A. Similarly, FIG. 11 may be a cross section of a device represented by FIGS. 2 or 3B or 3C if drain and source interconnection means and a passivating layer were added to these latter figures.

The MOS field-effect transistor device of FIG. 11, in contrast to the structure of FIG. 10, has source region 10 and drain region 13 formed in the semiconductor material body 21. However, the doping level in regions 10 and 11 are extremely low so that when the MOS field-effect transistor device is in the "off" condition, with a large reverse bias on the drain-substrate pn junction (meaning in FIG. 11 that drain region 13 is positive with respect to the substrate, i.e. other portion of semiconductor material body 21) that drain region 13 is completely depleted of charge carriers prior to avalanche breakdown of the drain-substrate pn junction. As a result, the drain region side of the depletion region around the drain-substrate junction extends into drain interconnection means 15 for sufficient reverse bias voltage. A similar result would be obtained at source region 10.

By ensuring that source region 10 and drain region 13 each do not contain sufficient impurity doping to reach a critical electrical field prior to complete depletion under reverse bias, the breakdown properties become determined essentially by a depletion region spread over a relatively long path over the metallurgical junction involved and by the conditions existing around the electrical contact means made to these regions. This situation, to a substantial extent, removes the influence of gate 16 from affecting breakdown and limits the lateral extent of the depletion region on the substrate side of the metallurgical junctions.

To assure these conditions exist, the structure of FIG. 11 uses highly doped polysilicon source interconnection means 12 and highly doped polysilicon drain interconnection means 15. Providing the interconnection means or electrical contacts in operations subsequent to providing regions 10 and 13 also leads to a slight diffusion into regions 10 and 13 shown just below the interface between the semiconductor material body 21 and these interconnection means. The depth of this diffusion is very shallow, approximately 0.1μm or less, and does not have a significant effect on the behavior of region 10 and 13 under reverse bias conditions.

The doped polysilicon n-type conductivity source and drain interconnection means 12 and 15, respectively, are doped with phosphorus to the extent of $10^{18}$ to $10^{19}$ atoms/cm$^3$. The phosphorus doping level concentration in the n-type conductivity source and drain regions 10 and 13, respectively, in semiconductor material body 21 is approximately of the order of 0.1 to 4 × $10^{16}$ atoms/cm$^3$. This is provided by an ion implantation step discussed below using a carefully controlled dose. The (i) high doping level of the doped polysilicon electrical contacts, and the (ii) low doping level of the source and drain regions, leads to the extending of the contact depletion region portions—those on the electrical contact side of the pn junctions around the source and drain regions, respectively—into the source and drain interconnection means very soon with increasing reverse biasing voltage on these pn junctions. The doping level of semiconductor material body 21 is of a p-type conductivity and is due to boron atoms being present in the, typically, silicon material thereof in a concentration less than approximately 5 × $10^{15}$ atoms/cm$^3$.

A threshold voltage adjust region, 21', also of p-type conductivity, may or may not be provided in semiconductor material body 21 immediately adjacent to the major surface of this body. This region is shown by an alternately long and short dash in a dashed line in FIG. 11. If provided to adjust the threshold voltage of the resulting MOS field-effect transistor, the region would usually be fabricated by implanting boron atoms reaching a concentration of typically around 2 × $10^{16}$ atoms/cm$^3$. The depth of threshold adjust region 21' below the major surface of body 21 may be less than, equal to, or exceed the depth of the source and drain region 10 and 13, respectively, but cannot be so deep that a depletion region around a reverse-biased drain region, for instance, would not reach beyond region 21' before breakdown.

The effects of increasing reverse bias voltage on the drain-substrate pn junction, i.e. an increasing positive voltage applied to the drain interconnection means 15 in FIG. 11 with respect to the substrate, are shown by the dashed lines displayed in that FIGURE. For low reverse bias voltages, a pair of long dashed lines on either side of the solid line depicting the metallurgical pn junction, separating the drain region 13 from the remainder of the semiconductor material body 21, represents the limits of the depletion region in this condition. That is, the depletion region occurs entirely within the semiconductor material body 21.

Since the immobile charge within the depletion regions on either side of the drain-substrate metallurgical junction must be equal, the depletion region around the curved portion of the pn junction extends less far into the channel region of the semiconductor material body 21 than it does into the drain region 13. This is because the receding of the depletion region boundaries from the pn junction with increasing reverse bias will more quickly include additional immobile charges in the depletion region on the semiconductor material body 21 side of the pn junction than on the drain region 13 side because of the greater radius of curvature of the depletion region boundary on the body side of the junction as opposed to the radius on the drain side of the junction. Thus, the depletion region will not extend into the channel region as rapidly and the punch-through voltage minimum will be increased.

For a higher reverse bias voltage on the drain interconnection means 15, the short dashed lines in FIG. 11 result. The depletion region boundary on the drain region 13 side of the metallurgical pn junction has now receded into the doped polysilicon interconnection means 15. Again, there has been relatively little increase in the depletion region limit on the substrate side of the pn junction into the channel, but rather the increase in the depletion region on the substrate side goes deeper into the substrate body. This is based on the fact that little more immobile charge is being uncovered by increasing reverse bias voltage in the drain interconnection means 15 in the direction parallel to the major surface of the semiconductor material body 21 (no further immobile charge is uncovered in region 13 as it is completely depleted). Consequently, to maintain equal amounts of immobile charge in the depletion region on both sides of the metallugical junction, little more immobile charge is uncovered on the substrate side in the channel region along this same direction with the increasing reverse bias voltage.

This being so, very short channel lengths can be used for the MOS field-effect transistor device of FIG. 11 without encountering punch-through. This use of short channel lengths, as indicated earlier, lowers the "on" condition channel resistance and reduces the semiconductor material body major surface area taken up by the device.

There is also a substantial improvement in the breakdown voltage minimum because in the condition shown by the pair of short-dashed lines in FIG. 11, the depletion region on the drain 13 side of the drain-substrate pn junction has receded into the drain interconnection means 15. While there is some curvature of the electric field in this geometry, the reverse bias voltage applied to the drain interconnection means 15 is spread over a substantial longer depletion region having less concentrated exposed immobile charge by virtue of the use of the lightly doped drain region 13 leading to a lower electric field for a particular reverse bias voltage. Further, with the boundary of the drain portion of the depletion region in the drain interconnection means 15, the influence of the gate 16 on breakdown is much reduced. Thus, the FIG. 11 structure obtains improved minimum punch-through voltages and breakdown voltages, but in a manner not requiring the forming of a long, thin tapering doped polysilicon region to serve as the source and drain regions.

For the structures of both FIG. 10 and 11, the avoidance of a substantial doping diffusion step to provide heavily doped source and drain regions in the semiconductor material body present, as is typically done, allows closer spacing of the effective portions of the gate conductor to the source and drain interconnection means contacts. This is so because no sideway, or lateral, diffusion of the source and drain regions need be allowed for in the packing of the MOS field-effect device in the major surface of the semiconductor material body. That is, in FIG. 10, the source and drain interconnection means are provided by a deposition of doped polysilicon and no further structure is provided in the semiconductor material body 21 which could diffuse laterally. On the other hand, in FIG. 11, the lightly doped portions of the source and drain regions in the semiconductor material body 21 may be provided through ion implantation which will self-align with gate conductor 16. This means that only a relatively small area in the semiconductor material body major surface need be used in forming a MOS field-effect device. This closer source and drain contact spacing with respect to the gate, permitting reduced distances across the device between the source and drain contacts, will tend to offset the somewhat larger distances involved between the effective source and drain, on the one hand, and the effective gate portions on the other, due to having the contacts serve as the effective source and drain regions.

Because of the importance of having the proper doping level in both (at least where more or less symmetrical capabilities are desired) the source region 10 and the drain region 13 of FIG. 11, to assure that depletion therein occurs prior to breakdown of the pn junction separating these regions from the remainder of the substrate, the doping requirements for these regions must be relatively precisely met. Rather than a concentration level alone being the criteria, the total number of net impurity atoms per unit area provided in the semiconductor material body below the portions of the semiconductor material body major surface intersected by the source and drain regions is to be controlled. That is, the ion implantation net dose must be controlled, i.e. the integral of the concentration over depth in the semiconductor material body must be controlled, so that the excess of phosphorus atoms in either drain region 13 and in source region 10 over the boron dopant atoms in region 21' (or in substrate 21' if no differentiated region 21' is provided) is due to a dose of less than approximately $1 \times 10^{13}$ atoms/cm$^2$.

Whether the proper doping levels for the source and drain region of FIG. 11 has been achieved can be determined by checking that the drain regions, for instance, are completely depleted when reverse biased without the junction being in breakdown, which will require the application of a reverse bias voltage of between 25 and 35 volts. On the other hand, for a p-channel device, the drain-substrate pn junction should completely deplete without the junction being in breakdown when subjected to a sufficient reverse bias voltage which will be between approximately 80 and 90 volts. In practice then, the breakdown voltage across, for instance, the drain-substrate pn junction in devices satisfying these requirements, will be found to be around 200 volts or more with the substrate and source commonly grounded.

Using an implantation energy of 150kv, the source regions 10 and drain regions 13 of FIG. 11 will be separated from the remainder of the semiconductor material body 21 by a pn junction being at a depth of approximately 1 μm below the major surface of the semiconductor material body 21. Source regions 10 and drain regions 13 will be separated from one another by approximately 2 to 4 μm below gate 16. Gate 16 can be either doped polysilicon or metal and will be separated from the major surface of semiconductor material body 21 by a portion of, typically, silicon dioxide of insulating material 19 usually about 2,000Å thick.

Figure 12:
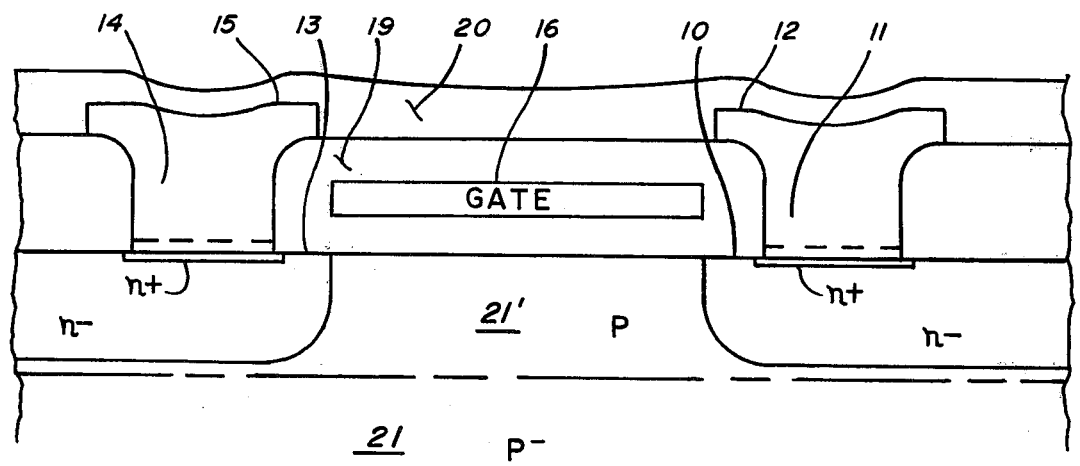
FIG. 12 shows a cross section of a portion of another version of the field-effect transistor device of the present invention that can also withstand a substantial reverse bias voltage.

Doped polysilicon is not the only material which can satisfactorily be used for making the source and drain interconnection means of FIG. 11. An alternative is shown in FIG. 12 where the source interconnection means 12 and the drain interconnection means 15 are formed by the use of multiple metal layer contacts, the first contact shown there being platinum which is provided in a manner to form platinum silicide at the interface between the platinum and the very shallow n+-type conductivity region implanted or diffused below these interconnection means in silicon semiconductor material body 21 (and in threshold adjust region 21' if present). In this arrangement, the regions marked in FIG. 12 n+ are provided by ion implantation, and are very shallow, being less than 0.1 μm below the major surface of semiconductor material body 21. Thereafter, various layers of metal on the platinum can be provided to form the interconnection means in one of the well known electrical contact structures for monolithic integrated circuits. Other interconnection means structures can be used with other materials such contacting the silicon with aluminum contacts or any other metallurgical arrangement which does not lead to spiking through the n+ regions provided below these contacts.

The embodiments of the invention in which an exclusive property or right is claimed are defined as follows:

1. A semiconductor device containing therein a first field-effect transistor device, having a source, drain, gate and substrate, and being capable of withstanding a relatively high voltage between said drain and said substrate and between said drain and said source when in an "off" condition, said field-effect transistor device comprising:

a semiconductor material body of a first conductivity type, in at least some parts of a first portion thereof serving as said substrate, and having a major surface where said first body portion intersects said major surface to form a first major surface portion, said first body portion having a first dopant distribution therein leading to said first conductivity type where said first dopant has a maximum concentration of less than $5 \times 10^{15}$ atoms per cubic centimeter except in a threshold voltage adjust surface region adjacent to said first major surface portion wherein a selected first dopant threshold adjust surface region distribution is provided;

a first drain region of a second conductivity type located in said first body portion and intersecting said first major surface portion, said first drain region having a second dopant net distribution therein for said second dopant in excess of said first dopant in said threshold voltage adjust surface region leading to said second conductivity type which is so distributed by having passed a maximum of $1 \times 10^{13}$ atoms of said second dopant per unit area through said intersection of said first drain region and said first major surface portion in excess of those first dopant atoms present immediately adjacent to this said intersection;

a first source region of said second conductivity type located in said first body portion and intersecting said first major surface portion, said first source region being spaced apart from said first drain region in said first major surface portion;

a first gate conductive means separated from said first major surface portion by a first insulating layer of a first thickness and located across said first insulating layer from that space occurring between said first drain and first source regions in said first major surface portion;

a drain region interconnection means in electrical contact with said first drain region; and a source region interconnection means in electrical contact with said first source region.

2. The device of claim 1 wherein said drain region interconnection means and said source region interconnection means are each of heavily doped polycrystalline silicon and said semiconductor material body is of doped silicon.

3. The device of claim 3 wherein said drain region interconnection means and said source region interconnection means each have a layer of platinum making said electrical contact to said first drain and first source regions, respectively, through platinum silicide material.

4. The device of claim 1 wherein said first source region has a third dopant distribution therein leading to said second conductivity type which is substantially identical to said second dopant distribution.

5. The device of claim 1 wherein there is contained another transistor device.

6. The device of claim 1 wherein there is further comprised:

a first plurality of regions of a second conductivity type, including a selected one of said first drain and said first source regions, each located in said semiconductor material body in such a manner as to intersect said first major surface portion in a first plurality of triangular surface portions completely separated in said first major surface portion and at least partly so by a first surface mesh formed by other portions of said first body portion, each said triangular surface portion in said first plurality thereof having each of those edges serving as boundaries thereof, including an outer edge, substantially parallel to one edge in every other triangular surface portion in said first plurality of triangular surface portions, said first plurality of triangular surface portions being arranged along a first direction in said first major surface portion such that each said outer edge in each said triangular surface portion in said first plurality thereof is substantially parallel to said first direction; and a second pluarlity of regions of said second conductivity type located in said semiconductor material body in such a manner as to intersect said first major surface portion in a second plurality of triangular surface portions completely separated in said first major surface portion and at least partly so separated by a second surface mesh formed by other portions of said semiconductor material body, each said triangular surface portion in said second plurality thereof having each of those edges serving as boundaries thereof, including an outer edge, substantially parallel to one edge in every other triangular surface portion in said second plurality of triangular surface portions, said second plurality of triangular surface portions being arranged along said first direction such that each said outer edge in each said triangular surface portion in said second plurality thereof is substantially parallel to said first direction, said first and second pluralities of triangular surface portions being adjacent but spaced apart from one another in said first major surface portion by portions of said first and second meshes with an outer edge of every other triangular surface portion in first plurality thereof being located just across said spacing from an outer edge of a triangular surface portion in said second plurality thereof.

7. The device of claim 1 wherein there is further comprised a plurality of regions, including a selected one of said first source and said first drain regions, located in said semiconductor material body in such a manner that each intersects said first major surface portion in a triangular surface portion with every said triangular surface portion being completely separated at said first major surface portion from one another, there being interposed therebetween a separating surface in said first major surface portion formed by other portions of said first body portion, and further, with said separating surface being associated so that all of said separating surface may be viewed as being apportioned for assignment to an associated one of said triangular surface portions in a manner to form extended triangular portions each containing therein its associated said triangular surface portion, said triangular surface portions being arranged with respect to one another in such a manner that said associated extended triangular surface portions form a densely packed hexagonal matrix structure.

8. The device of claim 1 wherein there is further comprised:

a mesh surface in said first major surface portion with at least a portion of said mesh surface formed as an intersecting network in a mesh pattern having trinagular openings; and a plurality of regions, including a selected one of said first source and said first drain regions, each located to have a surface thereof contained completely within one of said triangular openings.

9. The device of claim 1 wherein there is further comprised:

a first plurality of regions of a second conductivity type, including a selected one of said first drain and said first source regions, each located in said semiconductor material body in such a manner as to intersect said first major surface portion in a first plurality of quadrilateral surface portions completely separated in said first major surface portion and at least partly so by a first surface mesh formed by other portions of said first body portion, each said quadrilateral surface portion in said first plurality thereof each of those edges serving as boundaries thereof, including an outer edge, substantially parallel to one edge in every other quadrilateral surface portion in said first plurality of quadrilateral surface portions, said first plurality of quadrilateral surface portions being arranged along a first direction in said first major surface portion such that each said outer edge in each said quadrilateral surface portion in said first plurality thereof is substantially parallel to said first direction; and a second plurality of regions of said second conductivity type located in said semiconductor material body in such a manner as to intersect said first major surface portion in a second plurality of quadrilateral surface portions completely separated in said first major surface portion and at least partly so separated by a second surface mesh formed by other portions of said semiconductor material body, each said quadrilateral surface portion in said second plurality thereof having each of those edges serving as boundaries thereof, including an outer edge, substantially parallel to one edge in every other quadrilateral surface portion in said second plurality of quadrilateral surface portions, said second plurality of quadrilateral surface portions being arranged along said first direction such that each said outer edge in each said quadrilateral surface portion in said second plurality thereof is substantially parallel to said first direction, said first and second pluralities of quadrilateral surface portions being adjacent but spaced apart from one another in said first major surface portion by portions of said first and second meshes with an outer edge of every other quadrilateral surface portion in first plurality thereof being located just across said spacing from an outer edge of a quadrilateral surface portion in said second plurality thereof.

10. The device of claim 1 wherein there is further comprised a plurality of source and drain regions, including a selected one of said first source and said first drain regions, located in said semiconductor material body in such a manner that each intersects said first major surface portion in a quadrilateral surface portion with every said quadrilateral surface portion being completely separated at said first major surface portion from one another, there being interposed therebetween a separating surface in said first major surface portion formed by other portions of said first body portion, and further, with said separating surface being associated so that all of said separating surface may be viewed as being apportioned for assignment to an associated one of said quadrilateral surface portions in a manner to form extended quadrilateral portions each containing therein its associated said quadrilateral surface portion, said quadrilateral surface portions being arranged with respect to one another in such a manner that said associated extended quadrilateral surface portions form a densely packed rectangular matrix structure.

11. The device of claim 1 wherein there is further comprised:
a mesh surface in said first major surface portion with at least a portion of said mesh surface formed as an intersecting network in a mesh pattern having quadrilateral openings; and
a plurality of regions, including a selected one of said first source and said first drain regions, each located to have a surface thereof contained completely within one of said quadrilateral openings.

12. The device of claim 6 wherein said source region has a third dopant distribution therein leading to said second conductivity type which is substantially identical to said second dopant distribution.

13. The device of claim 6 wherein there is contained another transistor device.

14. The device of claim 6 wherein said triangular surface portions are formed as equilateral triangles.

15. The device of claim 7 wherein said source region has a third dopant distribution therein leading to said second conductivity type which is substantially identical to said second dopant distribution.

16. The device of claim 7 wherein there is contained another transistor device.

17. The device of claim 7 wherein said triangular surface portions are formed as equilateral triangles.

18. The device of claim 8 wherein said first source region has a third dopant distribution therein leading to said second conductivity type which is substantially identical to said second dopant distribution.

19. The device of claim 8 wherein there is contained another transistor device.

20. The device of claim 8 wherein said triangular openings are formed as equilateral triangles.

21. The device of claim 9 wherein said first source region has a third dopant distribution therein leading to said second conductivity type which is substantially identical to said second dopant distribution.

22. The device of claim 9 wherein there is contained another transistor device.

23. The device of claim 9 wherein said quadrilateral surface portions are formed as squares.

24. The device of claim 10 wherein said first source region has a third dopant distribution therein leading to said second conductivity type which is substantially identical to said second dopant distribution.

25. The device of claim 10 wherein there is contained another transistor device.

26. The device of claim 10 wherein said quadrilateral surface portions are formed as squares.

27. The device of claim 11 wherein said first source region has a third dopant distribution therein leading to said second conductivity type which is substantially identical to said second dopant distribution.

28. The device of claim 11 wherein there is contained another transistor device.

29. The device of claim 11 wherein said quadrilateral openings are formed as squares.

30. A semiconductor device containing therein a first field-effect transistor device having a source, drain and gate, and being capable of withstanding a relatively high voltage between said drain and said substrate and between said drain and said source when in an "off" condition, said field-effect transistor device comprising:
a semiconductor material body of a first conductivity type, in at least some parts of a first portion thereof serving as said substrate, and having a major surface where said first body portion intersects said major surface to form a first major surface portion, said first body portion having a first dopant distribution therein leading to said first conductivity type;

a first drain region of a second conductivity type located in said first body portion and intersecting said first major surface portion with a first drain pn junction separating said first drain region and remaining parts of said first body portion, said first drain region having a second dopant distributed therein leading to said conductivity type;

a first source region of said second conductivity type located in said first body portion and intersecting said first major surface portion, said first source region being spaced apart from said first drain region in said first major surface portion;

a first gate conductive means separated from said first major surface portion by a first insulating layer of a first thickness and located across said first insulating layer from that space occurring between said first drain and first source regions in said first major surface portion, with concentrations of said first and second dopants and said first insulating layer thickness being such that a reverse bias voltage applied across said first drain pn junction can be sufficiently large to form a depletion region in said first drain region which extends completely through said first drain region without breakdown occurring across said first drain pn junction;

a drain region interconnection means in electrical contact with said first drain region; and a source region interconnection means in electrical contact with said first source region.

31. The device of claim 30 wherein said drain region interconnection means and said source region interconnection means are even heavily doped polycrystalline silicon and said semiconductor material body is of doped silicon.

32. The device of claim 30 wherein said drain region interconnection means and said source region interconnection means each have a layer of platinum making said electrical contact to said first drain and first source regions, respectively, through platinum silicide material.

33. The device of claim 30 wherein said first source region has a third dopant distribution therein leading to said second conductivity type which is substantially identical to said second dopant distribution.

34. The device of claim 30 wherein there is contained another transistor device.

35. The device of claim 30 wherein there is further comprised:

a first plurality of regions of a second conductivity type, including a selected one of said first drain and said first source regions, each located in said semiconductor material body in such a manner as to intersect said first major surface portion in a first plurality of triangular surface portions completely separated in said first major surface portion and at least partly so by a first surface mesh formed by other portions of said first body portion, each said triangular surface portion in said first plurality thereof having each of those edges serving as boundaries thereof, including an outer edge, substantially parallel to one edge in every other triangular surface portion in said first plurality of triangular surface portions, said first plurality of triangular surface portion being arranged along a first direction in said first major surface portion such that each said outer edge in each said triangular surface portion in said first plurality thereof is substantially parallel to said first direction; and a second plurality of regions of said second conductivity type located in said semiconductor material body in such a manner as to intersect said first major surface portion in a second plurality of triangular surface portions completely separated in said first major surface portion and at least partly so by a second surface mesh formed by other portions of said semiconductor material body, each said triangular surface portion in said second plurality thereof having each of those edges serving as boundaries thereof, including an outer edge, substantially parallel to one edge in every other triangular surface portion in said second plurality of triangular surface portions, said second plurality of triangular surface portions being arranged along said first direction such that each said outer edge in each said triangular surface portion in said second plurality thereof is substantially parallel to said first direction, said first and second pluralitites of triangular surface portions being adjacent but spaced apart from one another in said first major surface portion by portions of said first and second meshes with an outer edge of every other triangular surface portion in first plurality thereof being located just across said spacing from an outer edge of a triangular surface portion in said second plurality thereof.

36. The device of claim 30 wherein there is further comprised a plurality of source and drain regions, including a selected one of said first source and said first drain regions located in said semiconductor material body in such a manner that each intersects said first major surface portion in a trinagular surface portion with every said triangular surface portion being completely separated at said first major surface portion from one another, there being interposed therebetween a separating surface in said first major surface portion formed by other portions of said first body portion, and further, with said separating surface being associated so that all of said separating surface may be viewed as being apportioned for assignment to an associated one of said triangular surface portions in a manner to form extended triangular portions each containing therein its associated said triangular surface portion, said triangular surface portions being arranged with respect to one another in such a manner that said associated extended triangular surface portions form a densely packed hexagonal matrix structure.

37. The device of claim 30 wherein there is further comprised:

a mesh surface in said first major surface portion with at least a portion of said mesh surface formed as an intersecting network in a mesh pattern having triangular openings; and a plurality of regions, including a selected one of said first source and said first drain regions, each located to have a surface thereof contained completely within one of said triangular openings.

38. The device of claim 30 there is further comprised:

a first plurality of regions of a second conductivity type, including a selected one of said first drain and said first source regions, each located in said semiconductor material body in such a manner as to intersect said first major surface portion in a first plurality of quadrilateral surface portions completely separated in said first major surface portion and at least partly so by a first surface mesh formed by other portions of said first body portion, each said quadrilateral surface portion in said first plurality thereof having each of those edges serving as boundaries thereof, including an outer edge, substantially parallel to one edge in every other quadrilateral surface portion in said first plurality of quadrilateral surface portions, said first plurality of quadrilateral surface portions being arranged along a first direction in said first major surface portion such that each said outer edge in each said quadrilateral surface portion in said first plurality thereof is substantially parallel to said first direction; and a second plurality of regions of said second conductivity type located in said semiconductor material body in such a manner as to intersect said first major surface portion in a second plurality of quadrilateral surface portions completely separated in said first major surface portion and at least partly so by a second surface mesh formed by other portions of said semiconductor material body, each said quadrilateral surface portion in said second plurality thereof having each of those edges serving as boundaries thereof, including an outer edge, substantially parallel to one edge in every other quadrilateral surface portion in said second plurality of quadrilateral surface portions, said second plurality of quadrilateral surface portions being arranged along said first direction such that each said outer edge in each said quadrilateral surface portion in said second plurality thereof is substantially parallel to said first direction, said first and second pluralities of quadrilateral surface portions being adjacent but spaced apart from one another in said first major surface portion by portions of said first and second meshes with an outer edge of every other quadrilateral surface portion in first plurality thereof being located just across said spacing from an outer edge of a quadrilateral surface portion in said second plurality thereof.

39. The device of claim 30 wherein there is further comprised a plurality of source and drain regions, including a selected one of said first source and said first drain regions, located in said semiconductor material body in such a manner that each intersects said first major surface portion in a quadrilateral surface portion with every said source and said drain quadrilateral surface portion being completely separated at said first major surface from one another, there being interposed therebetween a separating surface in said first major surface portion formed by other portions of said first body portion, and further, with said separating surface being associated so that all of said separating surface may be viewed as being apportioned for assignment to an associated one of said quadrilateral surface portions in a manner to form extended quadrilateral portions each containing therein its associated said quadrilateral surface portion, said quadrilateral surface portions being arranged with respect to one another in such a manner that said associated extended quadrilateral surface portions form a densely packed rectangular matrix structure.

40. The device of claim 30 wherein there is further comprised:
a mesh surface in said first major surface portion with at least a portion of said mesh surface formed as an intersecting network in a mesh pattern having quadrilateral openings; and
a plurality of regions, including a selected one of said first source and said first drain regions, each located to have a surface thereof contained completely within one of said quadrilateral openings.

41. The device of claim 35 wherein said first source region has a third dopant distribution therein leading to said second conductivity type which is substantially identical to said second dopant distribution.

42. The device of claim 35 wherein there is contained another transistor device.

43. The device of claim 35 wherein said triangular surface portions are formed as equilateral triangles.

44. The device of claim 36 wherein said first source region has a third dopant distribution therein leading to said second conductivity type which is substantially identical to said second dopant distribution.

45. The device of claim 36 wherein there is contained another transistor device.

46. The device of claim 36 wherein said triangular surface portions are formed as equilateral triangles.

47. The device of claim 37 wherein said first source region has a third dopant distribution therein leading to said second conductivity type which is substantially identical to said second dopant distribution.

48. The device of claim 37 wherein there is contained another transistor device.

49. The device of claim 37 wherein said triangular openings are formed as equilateral triangles.

50. The device of claim 38 wherein said first source region has a third dopant distribution therein leading to said second conductivity type which is substantially identical to said second dopant distribution.

51. The device of claim 38 wherein there is contained another transistor device.

52. The device of claim 38 wherein said quadrilateral surface portions are formed as squares.

53. The device of claim 39 wherein said first source region has a third dopant distribution therein leading to said second conductivity type which is substantially identical to said second dopant distribution.

54. The device of claim 39 wherein there is contained another transistor device.

55. The device of claim 39 wherein said quadrilateral surface portions are formed as squares.

56. The device of claim 40 wherein said first source region has a third dopant distribution therein leading to said second conductivity type which is substantially identical to said second dopant distribution.

57. The device of claim 40 wherein there is contained another transistor device.

58. The device of claim 40 wherein said quadrilateral openings are formed as squares.

* * * * *